United States Patent
Valefi et al.

(10) Patent No.: US 10,236,203 B2
(45) Date of Patent: Mar. 19, 2019

(54) LITHOGRAPHIC APPARATUS SUBSTRATE TABLE AND METHOD OF LOADING A SUBSTRATE

(71) Applicant: ASML Netherlands B.V., Veldhoven (NL)

(72) Inventors: Mahdiar Valefi, Eindhoven (NL); Raymond Wilhelmus Louis Lafarre, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/767,514

(22) PCT Filed: Sep. 28, 2016

(86) PCT No.: PCT/EP2016/073033
§ 371 (c)(1),
(2) Date: Apr. 11, 2018

(87) PCT Pub. No.: WO2017/071900
PCT Pub. Date: May 4, 2017

(65) Prior Publication Data
US 2018/0286738 A1    Oct. 4, 2018

(30) Foreign Application Priority Data
Oct. 29, 2015    (EP) .................... 15192099

(51) Int. Cl.
*H01L 21/683*    (2006.01)
*G03F 7/20*      (2006.01)
*H01L 21/687*    (2006.01)

(52) U.S. Cl.
CPC ...... *H01L 21/6838* (2013.01); *G03F 7/70708* (2013.01); *G03F 7/70716* (2013.01);
(Continued)

(58) Field of Classification Search
CPC ............. G03F 7/70708; G03F 7/70716; G03F 7/70775; H01L 21/6838; H01L 21/6831; H01L 21/6875; H01L 21/68757
See application file for complete search history.

(56) References Cited

U.S. PATENT DOCUMENTS

| | | | | |
|---|---|---|---|---|
| 2005/0248746 A1* | 11/2005 | Zaal | ....................... | G03F 7/707 355/75 |
| 2006/0006340 A1* | 1/2006 | Compen | ................. | G03F 7/707 250/440.11 |

(Continued)

FOREIGN PATENT DOCUMENTS

| | | | |
|---|---|---|---|
| EP | 0456426 A1 | 11/1991 | |
| EP | 1482370 A1 | 12/2004 | |

(Continued)

OTHER PUBLICATIONS

International Search Report and Written Opinion of the International Searching Authority directed to related International Patent Application No. PCT/EP2016/073033, dated Jan. 4, 2017; 9 pages.

(Continued)

*Primary Examiner* — Deoram Persaud
(74) *Attorney, Agent, or Firm* — Sterne, Kessler, Goldstein & Fox P.L.L.C.

(57) ABSTRACT

A lithographic apparatus substrate table comprises a plurality of first projections, whereby the first projections define a first substrate supporting plane and a plurality of second projections, whereby the second projections define a second substrate supporting plane. The substrate table further comprises a clamping device configured to exert a clamping force onto the substrate. The second substrate supporting plane is parallel to the first substrate supporting plane. The second substrate supporting plane is offset in respect of the first substrate supporting plane in a direction perpendicular to the first and second substrate supporting planes. The (Continued)

lithographic apparatus substrate table is configured to support the substrate on the second projections at the second substrate supporting plane before application of the clamping force by the clamping device. The second projections are configured to deform upon application by the clamping device of the clamping force onto the substrate, thereby providing the substrate to move from the second substrate supporting plane to the first substrate supporting plane when clamped by the clamping device.

11 Claims, 4 Drawing Sheets

(52) U.S. Cl.
CPC ...... *G03F 7/70775* (2013.01); *H01L 21/6831* (2013.01); *H01L 21/6875* (2013.01); *H01L 21/68757* (2013.01)

(56) References Cited

U.S. PATENT DOCUMENTS

| | | | | |
|---|---|---|---|---|
| 2007/0217114 | A1* | 9/2007 | Sasaki | ............... C23C 14/505 |
| | | | | 361/145 |
| 2008/0158538 | A1* | 7/2008 | Puyt | ............... G03F 7/707 |
| | | | | 355/72 |
| 2010/0019462 | A1 | 1/2010 | Chen et al. | |
| 2010/0085551 | A1 | 4/2010 | Vermeulen et al. | |
| 2013/0094005 | A1* | 4/2013 | Kunnen | ............... G03F 7/70875 |
| | | | | 355/30 |
| 2013/0321788 | A1 | 12/2013 | Ockwell et al. | |
| 2015/0131064 | A1* | 5/2015 | Laurent | ............... G03F 7/70341 |
| | | | | 355/30 |
| 2016/0187791 | A1* | 6/2016 | Houben | ............... G03F 7/707 |
| | | | | 355/72 |
| 2017/0045828 | A1* | 2/2017 | Van Sommeren | ............................ |
| | | | | H01L 21/67028 |

FOREIGN PATENT DOCUMENTS

| | | |
|---|---|---|
| JP | 2002-134599 A | 5/2002 |
| JP | 2015-167159 A | 9/2015 |
| WO | WO 2011/131390 A1 | 10/2011 |
| WO | WO 2015/043890 A1 | 4/2015 |
| WO | WO 2015/106860 A1 | 7/2015 |
| WO | WO 2017001135 A1 * | 1/2017 ............. G03F 7/707 |

OTHER PUBLICATIONS

International Preliminary Report on Patentability directed to related International Patent Application No. PCT/EP2016/073033, dated May 1, 2018; 6 pages.

* cited by examiner

LITHOGRAPHIC APPARATUS SUBSTRATE TABLE AND METHOD OF LOADING A SUBSTRATE

BACKGROUND

Cross Reference to Related Applications

This application claims priority of EP application 15192099.8 which was filed on 2015 Oct. 29 and which is incorporated herein in its entirety by reference.

Field of the Invention

The present invention relates to a lithographic apparatus substrate table, a lithographic apparatus comprising such substrate table and a method of loading a substrate.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A substrate table (also referred to as wafer table) holds the substrate and provides for an e.g. scanning or stepping movement of the substrate. The substrate is clamped to the substrate table by means of a clamping device. In non-vacuum applications, the clamping device may comprise a vacuum clamp. In vacuum applications, such as in Extreme Ultraviolet (EUV), the clamping device may comprise an electrostatic clamp.

In lithography, a high accuracy is desired so as to provide a small overlay error. Errors in the positioning of the substrate onto the substrate table may translate into overlay errors. For example, during exposure of the substrate, irradiation may provide for a heating of the substrate at the location of the exposure, causing a heat load. The heat load provides for an expansion of the substrate. Such expansion may be modeled by a thermal expansion model and taken into account in order to reduce overlay error. As present models are linear, they are not able to take account of substrate slip caused by heat load induced thermal stresses. Therefore, in order to prevent such substrate slip, a high friction force at the interface of the substrate and the substrate table is desired.

On the other hand, when loading the substrate onto the substrate table, low stress loading is desired, which tends to require that the friction force between the substrate and the substrate table is low and stable. As a result, requirements tend to conflict. In the case of an EUV application, this problem is even aggravated, as more heat is required per square millimeter to develop the resist, causing more thermal load onto the substrate, while on the other hand the requirements for overlay in EUV are more stringent.

SUMMARY

It is desirable to provide a low overlay error exposure.

According to an embodiment of the invention, there is provided a lithographic apparatus substrate table constructed to hold a substrate, the lithographic apparatus substrate table comprising:
a plurality of first projections, whereby the first projections define a first substrate supporting plane,
a plurality of second projections, whereby the second projections define a second substrate supporting plane,
a clamping device configured to exert a clamping force onto the substrate,
wherein the second substrate supporting plane is parallel to the first substrate supporting plane, the second substrate supporting plane being offset in respect of the first substrate supporting plane in a direction perpendicular to the first and second substrate supporting planes,
wherein the lithographic apparatus substrate table is configured to support the substrate on the second projections at the second substrate supporting plane before application of the clamping force by the clamping device,
the second projections being configured to deform upon application by the clamping device of the clamping force onto the substrate, thereby providing the substrate to move from the second substrate supporting plane to the first substrate supporting plane when clamped by the clamping device.

In another embodiment of the invention, there is provided a lithographic projection apparatus comprising the lithographic apparatus substrate table according to the invention.

According to a further embodiment of the invention, there is provided a method of loading a substrate onto a substrate table of a lithographic apparatus, the method comprising:
providing a substrate table comprising:
a plurality of first projections, whereby the first projections define a first substrate supporting plane,
a plurality of second projections, whereby the second projections define a second substrate supporting plane, and
a clamping device configured to exert a clamping force onto the substrate,
  wherein the second substrate supporting plane is parallel to the first substrate supporting plane, the second substrate supporting plane being offset in respect of the first substrate supporting plane in a direction perpendicular to the first and second substrate supporting planes,
  supporting the substrate onto the second projections at the second substrate supporting plane, before application of the clamping force by the clamping device,
  applying, by the clamping device, the clamping force onto the substrate causing the second projections to deform elastically, thereby providing the substrate to move from the second substrate supporting plane to the first substrate supporting plane when clamped by the clamping device.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
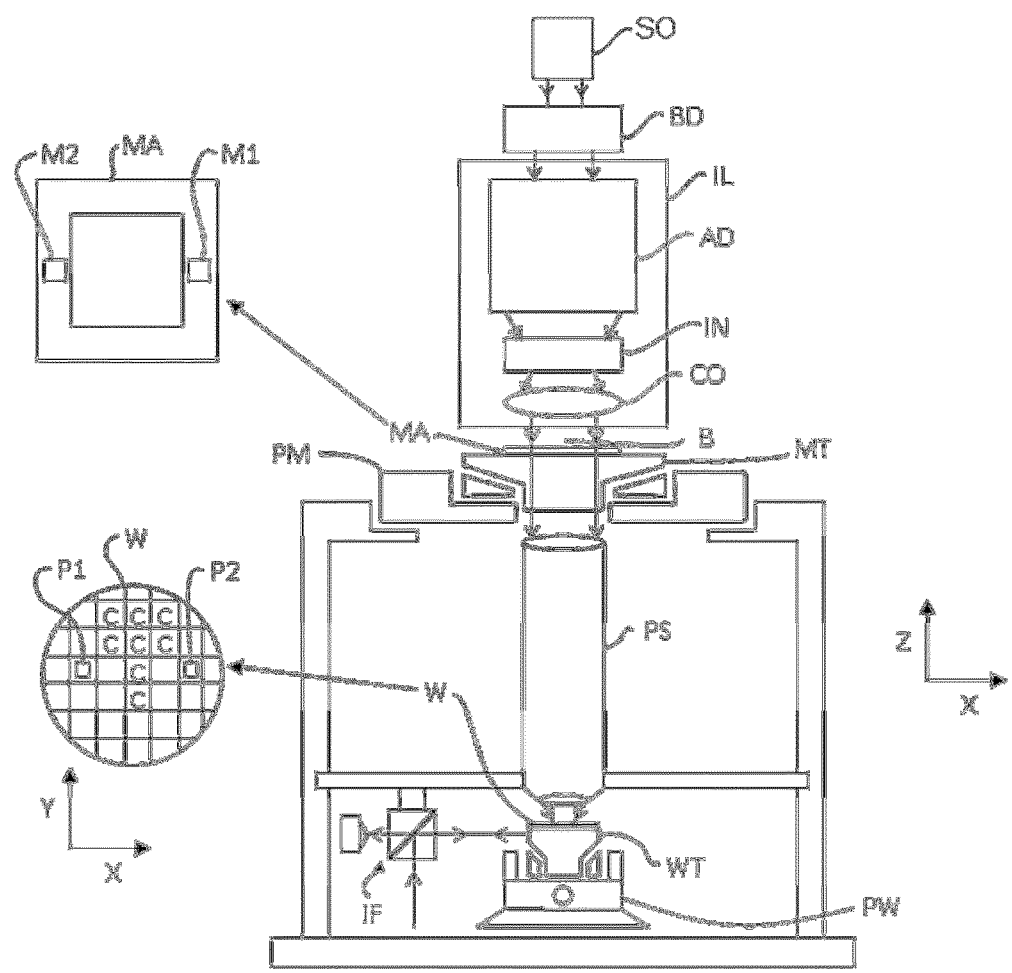
FIG. 1 depicts a lithographic apparatus in which the invention may be embodied.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.
2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
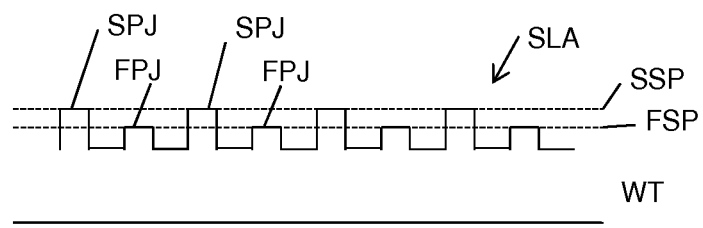
FIGS. 2A-2C depict a highly schematic side view of a substrate table in accordance with an embodiment of the invention.
Figure 2B:
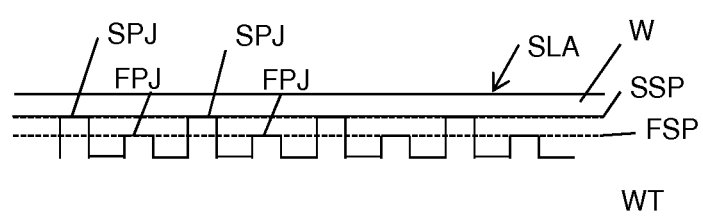
Figure 2C:
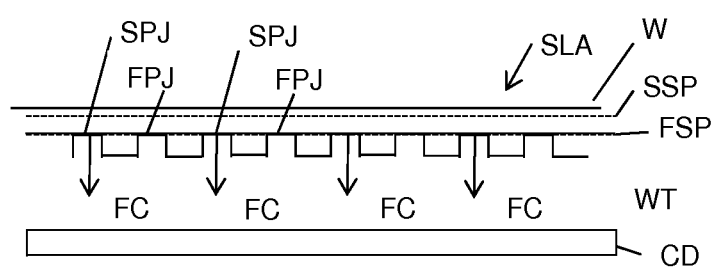

FIGS. 2A-2C depicts a highly schematic side view of a substrate table WT. The substrate table WT comprises a plurality of first projections FPJ and a plurality of second projections SPJ. The projections may for example be formed by pillars or any other suitable projection on the substrate table. The projections may also be referred to as protrusions. The substrate table WT is provided with a substrate loading area SLA onto which a substrate W is loaded. The first projections are spread over the substrate loading area SLA and define a first substrate supporting plane FSP. The second projections SPJ are also spread over the substrate loading area SLA and define a second substrate supporting plane SSP. The first and second substrate supporting planes are at a distance from each other, i.e. are spaced apart, in a distance normal (i.e. perpendicular) to the first and second substrate supporting planes. The substrate table WT further comprises a clamping device CD configured to clamp the substrate W, i.e. apply a clamping force FC onto the substrate W to clamp it to the substrate table, as will be described in more detail below. The clamping device CD may be any clamping device, such as an electrostatic clamping device that applies an electrostatic force onto the substrate, or a vacuum clamping device that applies a vacuum force onto the substrate.

The second substrate supporting plane SSP resides further from the substrate table than the first substrate supporting plane FSP. The second projections SPJ extend further then the first projections FPJ in the direction perpendicular to the first and second substrate supporting planes. As a result, when having loaded the substrate onto the substrate table, the substrate is initially held by the second projections SPJ that define the second substrate supporting plane SSP, as depicted in FIG. 2B. The second projections exhibit a certain degree of resiliency, i.e. have a finite stiffness. When applying the clamping force FC by the clamping device CD, the second projections SPJ deform (e.g. elastically), causing the substrate W to move from being held at the second substrate supporting plane SSP to being held at the first substrate supporting plane FSP, as depicted in FIG. 2C. Thus, when having loaded the substrate W onto the substrate table WT, before application of the clamping force FC, the substrate W is only supported by the second projections SPJ. As a result, a friction force by the substrate table WT is defined by a friction force at the interface of the second projections SPJ only. When clamping the substrate W by the clamping force FC, the substrate W moves to the first substrate loading surface FSP, where it is supported by the first and the second projections. Thus, a friction by the substrate table WT is defined by the first and the second projections. As a result, before clamping the substrate W, the friction force is lower than when clamping the substrate W, as in the first case, only the second projections SPJ contribute to friction, while in the second case, both the first and the second projections contribute to friction forces at the interface of substrate W. Thus, during loading of the substrate W, a relatively low friction may be provided to promote low stress loading, while during clamping, a relatively high friction force may be provided to promote a defined positioning, even during irradiation induced (local) heating of the substrate W. Thus, low stress loading of the substrate W requiring low friction during loading, may be combined with defined and accurate positioning during clamping, requiring high friction clamping. Furthermore, as a result of the invention, a contact surface between the substrate W and the substrate table WT during clamping may increase, which may enable to make use of van der Waals forces in the clamping of the substrate W to the substrate table WT. In accordance with the invention, the second substrate supporting plane SSP is defined by the second projections SPJ while the first substrate supporting plane FSP is defined by the first projections FPJ.

It is noted that the concept as described in this document may be applied with substrates having a flat back surface to be held by the substrate table, as well as with substrates having a profiled back surface. In the case of a substrate having a profiled back surface, the first and second substrate supporting planes as defined by the top surfaces of the first and second projections, may be profiled accordingly. The material subjected to this concept may be SiC, Si, SiO2, DLC (Diamond Like Coating) coated substrate, Nitride coated substrates, $Al_2O_3$ and other material is used currently in Lithography industry. The projections may be fabricated in any suitable way, e.g. using photolithography and laser processing. As substrate table burls (as discussed below with reference to FIGS. 3A and 3B) may also be fabricated, e.g. using photolithography and laser processing, a similar or same process may be applied.

Figure 3A:
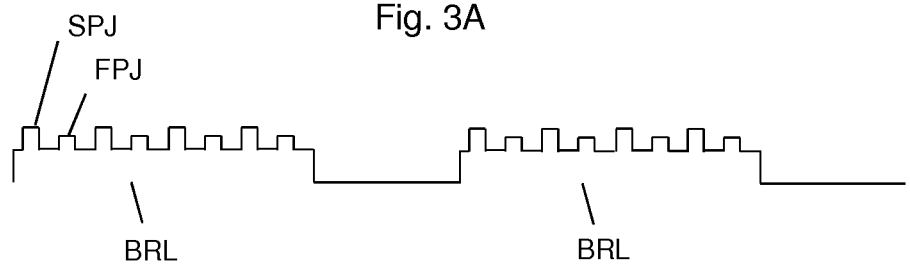
FIGS. 3A and 3B depict other embodiments of a substrate table in accordance with the invention.
Figure 3B:

FIG. 3A depicts a detailed view of a part of a substrate table WT in accordance with an embodiment of the invention. The substrate table WT comprises a plurality of burls BRL, configured to carry the substrate W. The plurality of burls BRL may be spread over an area which is substantially equal to or larger than the substrate to be carried. The burls BRL in the embodiment are each provided with a plurality of first projections FPJ and second projections SPJ, similar to the first and second projections as have been described with reference to FIG. 2A-2C. Accordingly, during loading of the substrate W, the second projections SPJ of each burl BRL contact the substrate W, while when having applied the clamping force by the clamping device, the second projections SPJ deform causing the substrate to move from the second substrate supporting plane SSP to the first substrate supporting plane FSP, and accordingly being held by both the first and the second projections of each burl. As depicted in FIG. 3B, the second projections SPJ may be provided with a spherical SPH top surface facing the substrate to be carried or a flat FLA top surface facing the substrate to be carried. Furthermore, the second projections SPJ may be provided with a "mushroom like" MSH shape, whereby a cross section of the second projection SPJ increases in a direction towards the substrate that is to be carried. The first and second projections may be dimensioned with different aspect ratios. The shape of second projection SPJ can influence the friction force. For instance, the advantage of mushroom like shape will be higher friction force at the wafer interface due to larger contact area.

Figure 4:
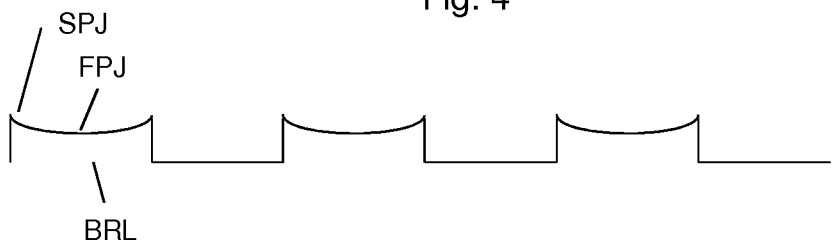
FIG. 4 depicts yet another embodiment of a substrate table in accordance with the invention and FIGS. 5A-C depict further embodiments of a substrate table in accordance with the invention.

FIG. 4 depicts a detailed view of a part of a substrate table in accordance with another embodiment of the invention. The substrate table WT comprises a plurality of burls BRL, configured to carry the substrate. The plurality of burls BRL may be spread over an area which is substantially equal to or larger than the substrate to be carried. The burls BRL in the embodiment in accordance with FIG. 4 are each provided with a top surface, i.e. a surface of the burl facing the second substrate loading surface SSP, which surface has a concave shape. A circumferential outer part of the burl BRL at a circumferential edge of the concave shaped surface thereby forms the second projection SPJ, while a remainder, i.e. a center part, of the burl forms the first projection FPJ.

Thereby, a lateral stiffness may be large. An example of material may be materials with high H/E=0.1-016 (H: hardness, E: Elastic modulus) such as DLC (a: c-H) coated substrates which are relatively strain tolerant.

Figure 5A:
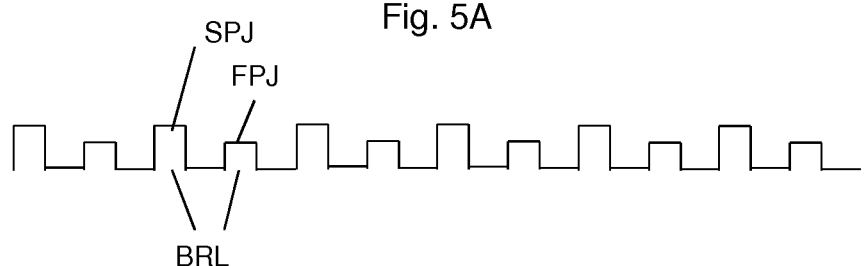
Figure 5B:
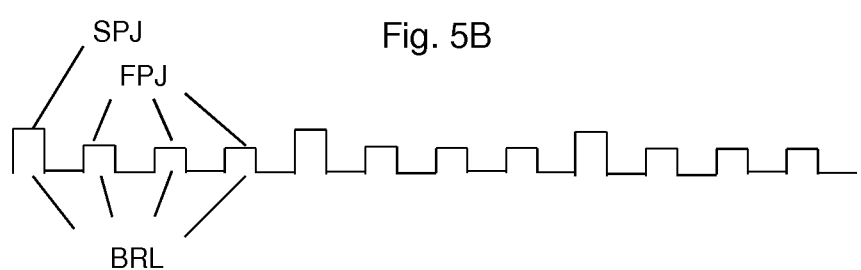
Figure 5C:
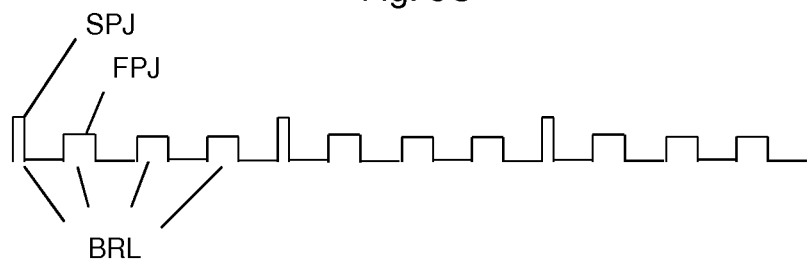

FIG. 5A-5C depict a detailed view of a part of a substrate table in accordance with further embodiments of the invention. In these embodiments, the first projections FPJ and second projections SPJ form the plurality of burls BRL configured to carry the substrate. Accordingly, the first and second projections may be spread over an area which is substantially equal to or larger than the substrate to be carried. The burls BRL in the embodiment are formed by the plurality of first projections FPJ and second projections SPJ. In the embodiment as schematically depicted in FIG. 5A, the amount of first projections FPJ approximately equals the amount of second projections SPJ, the first and second projections being intermittently placed. A diameter of the first projections FPJ may differ from a diameter of the second projections SPJ. For example, the diameter of the second projections SPJ may be smaller than a diameter of the first projections FPJ. FIG. 5B depicts an embodiment wherein the amount of first projections FPJ is larger than the amount of second projections SPJ. For example, per three first projections FPJ one second projection SPJ is provided. In such embodiment, a friction obtained during the clamping can be significantly higher than the friction obtained during the loading, given that the amount of second projections SPJ is significantly larger than the amount of first projections FPJ. A similar effect may be obtained by the embodiment which is depicted in FIG. 5C, wherein a diameter of the second projections SPJ as seen in a direction along the first and second substrate supporting planes (and hence a contact surface of the second projections SPJ facing the substrate) is smaller than the diameter and hence the contact area of the first projections FPJ, as seen in a direction along the first and second substrate supporting planes. An advantage of this configuration is that this may enable to tune friction at substrate load and substrate clamping depending on contact area and burl stiffness.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate.

The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus substrate table constructed to hold a substrate, the lithographic apparatus substrate table comprising:
   first and second projections defining corresponding first and second substrate supporting planes; and
   a clamping device configured to exert a clamping force onto the substrate,
   wherein the second substrate supporting plane is parallel to the first substrate supporting plane, the second substrate supporting plane being offset with respect to the first substrate, supporting plane in a direction perpendicular to the first and second substrate supporting planes,
   wherein the lithographic apparatus substrate table is configured to support the substrate on the second projections at the second substrate supporting plane before application of the clamping force by the clamping device, and
   wherein the second projections are configured to deform upon application by the clamping device of the clamping force onto the substrate, thereby providing the substrate to move from the second substrate supporting plane to the first substrate supporting plane when clamped by the clamping device.

2. The lithographic apparatus substrate table of claim 1, wherein the substrate table comprises a plurality of burls configured for supporting the substrate, each burl being provided with at least one first projection and at least one second projection.

3. The lithographic apparatus substrate table of claim 2, wherein:
   a surface of the burl facing the second substrate loading surface has a concave shape,
   a circumferential outer part of the burl at a circumferential edge of the concave shaped surface forming the second projection, and
   a center part of the burl forming the first projection.

4. The lithographic apparatus substrate table of claim 1, wherein the second projections comprise a spherically shaped substrate carrying surface.

5. The lithographic apparatus substrate table of claim 1, wherein the second projections comprise a flat substrate carrying surface.

6. The lithographic apparatus substrate table of claim 1, wherein the second projections comprise a cross section as seen in a direction of the first and second substrate loading surfaces, which cross section increases towards the second substrate supporting plane.

7. The lithographic apparatus substrate table of claim 1, wherein the substrate table comprises a plurality of burls configured for supporting the substrate, each of the first and second projections forming a burl.

8. The lithographic apparatus substrate table of claim 1, wherein the amount of the first projections exceeds the amount of the second projections of the substrate table.

9. The lithographic apparatus substrate table of claim 1, wherein a cross sectional diameter of the first projections, as seen in a direction parallel to the first and second substrate loading surfaces exceeds a cross sectional diameter of the first projections.

10. A lithographic apparatus comprising:
    a lithographic apparatus substrate table constructed to hold a substrate, the lithographic apparatus substrate table comprising:
    first and second projections defining respective first and second supporting planes, and
    a clamping device configured to exert a clamping force onto the substrate,
    wherein the second substrate supporting plane is parallel to the first substrate supporting plane, the second substrate supporting plane being offset with respect to the first substrate supporting plane in a direction perpendicular to the first and second substrate supporting planes,
    wherein the lithographic apparatus substrate table is configured to support the substrate on the second projections at the second substrate supporting plane before application of the clamping force by the clamping device, and
    wherein the second projections are configured to deform upon application by the clamping device of the clamping force onto the substrate, thereby providing the substrate to move from the second substrate supporting plane to the first substrate supporting plane when clamped by the clamping device.

11. A method of loading a substrate onto a substrate table of the lithographic apparatus of claim 10, the method comprising:
    supporting the substrate on the second projections at the second substrate supporting plane, before application of the clamping force by the clamping device; and
    applying by the clamping device the clamping force onto the substrate causing the second projections to deform, thereby providing the substrate to move from the second substrate supporting plane to the first substrate supporting plane when clamped by the clamping device.

* * * * *